(12) United States Patent
Kim

(10) Patent No.: US 6,865,214 B2
(45) Date of Patent: Mar. 8, 2005

(54) WAVELENGTH TUNABLE VCSEL

(75) Inventor: Taek Kim, Seoul (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 0 days.

(21) Appl. No.: 10/447,952

(22) Filed: May 30, 2003

(65) Prior Publication Data

US 2004/0028092 A1 Feb. 12, 2004

(30) Foreign Application Priority Data

Aug. 7, 2002 (KR) ........................................ 2002-46564

(51) Int. Cl.$^7$ .............................. H01S 3/08; H01S 5/00
(52) U.S. Cl. ............................................ 372/96; 372/43
(58) Field of Search .......................... 372/43–50, 96–99

(56) References Cited

U.S. PATENT DOCUMENTS

| | | | | |
|---|---|---|---|---|
| 5,136,603 A | * | 8/1992 | Hasnain et al. | 372/50 |
| 5,216,686 A | * | 6/1993 | Holm et al. | 372/45 |
| 5,283,447 A | * | 2/1994 | Olbright et al. | 257/85 |
| 5,351,256 A | * | 9/1994 | Schneider et al. | 372/45 |
| 5,577,064 A | * | 11/1996 | Swirhun et al. | 372/96 |
| 5,594,751 A | * | 1/1997 | Scott | 372/46 |
| 6,014,395 A | * | 1/2000 | Jewell | 372/45 |
| 6,014,400 A | * | 1/2000 | Kobayashi | 372/96 |
| 6,040,590 A | * | 3/2000 | OBrien et al. | 257/94 |
| 6,185,241 B1 | * | 2/2001 | Sun | 372/96 |
| 6,233,267 B1 | * | 5/2001 | Nurmikko et al. | 372/46 |
| 6,269,109 B1 | * | 7/2001 | Jewell | 372/43 |
| 6,399,407 B1 | * | 6/2002 | O'Brien et al. | 438/29 |
| 6,611,539 B2 | * | 8/2003 | Ledentsov et al. | 372/20 |
| 6,687,280 B1 | * | 2/2004 | Kajita | 372/96 |
| 6,697,413 B2 | * | 2/2004 | Hwang et al. | 372/96 |
| 6,700,914 B2 | * | 3/2004 | Yokouchi et al. | 372/45 |
| 2001/0050934 A1 | * | 12/2001 | Choquette et al. | 372/43 |
| 2002/0094004 A1 | * | 7/2002 | Furukawa | 372/46 |
| 2003/0007528 A1 | * | 1/2003 | Uchiyama et al. | 372/46 |
| 2003/0021322 A1 | * | 1/2003 | Steinle et al. | 372/50 |

OTHER PUBLICATIONS

Chang–Hasnain et al., "Continuous Wavelength Tuning of Two–Electrode Vertical Cavity Surface Emitting Lasers", Electronic Letters, 1991, pp. 1002–1003, vol. 23 No. 11, IEE Stevenage, Great Britain.

* cited by examiner

Primary Examiner—Minsun Oh Harvey
Assistant Examiner—Phillip Nguyen
(74) Attorney, Agent, or Firm—Burns, Doane, Swecker & Mathis, L.L.P.

(57) ABSTRACT

A wavelength tunable VCSEL is provided. The wavelength tunable VCSEL includes a current constricting layer which is formed on a lower distributed Bragg reflector, upper and lower electrodes for laser oscillation, and additional electrodes which are formed on a predetermined region of an upper distributed Bragg reflector from which light is emitted so as to vary a width of an effective resonance region. Compared to an existing VCSEL, the wavelength tunable VCSEL can rapidly change a wavelength of emitted light and prevent the deterioration of gain characteristics of laser oscillation due to variations in the width of the effective resonance region according to variations in a temperature. As a result, a wavelength tunable region of emitted laser can be increased.

4 Claims, 3 Drawing Sheets

WAVELENGTH TUNABLE VCSEL

BACKGROUND OF THE INVENTION

This application claims the priority of Korean Patent Application No. 2002-46564 filed on Aug. 7, 2002 in the Korean Intellectual Property Office, the disclosure of which is incorporated herein in its entirety by reference.

1. Field of the Invention

The present invention relates to a semiconductor laser, and more particularly, to a wavelength tunable vertical cavity surface emitting laser diode (VCSEL).

2. Description of the Related Art

A VCSEL has a structure in which distributed Bragg reflectors (DBRs), each having a refractive index of 99%, are formed over and under an active layer to resonate light in a direction to perpendicular to stacked layers. The DBR is formed by stacking materials having a great difference in a refractive index and similar lattice constants so as to be epitaxially grown, e.g., by alternatively stacking GaAs and AlAs or by alternatively stacking a pair of dielectric materials, having a great difference in a refractive index, selected from dielectric materials, such as a silicon oxide layer $SiO_2$, an aluminum oxide layer $Al_2O_3$, and a titanium oxide layer $TiO_2$. In such a DBR, it is preferable that an energy bandgap is greater than an oscillation wavelength to prevent light from being absorbed, and the greater a difference between refractive indexes of two materials constituting the DBR, the better.

FIG. 1 is a cross-sectional view of a conventional VCSEL having a DBR. Referring to FIG. 1, a lower DBR 21 is formed on a substrate (not shown). The lower DBR 21 is formed by alternatively stacking two materials 21a and 21b having relatively different refractive indexes. An n-contact layer 22 is formed on the lower DBR 21. A cavity resonator layer C, which is a stack of an n-lower carrier limiting layer 23, an active layer 24, and a p-upper carrier limiting layer 25, is formed on the n-contact layer 22. A current constricting layer 26, which limits the inflow of a current for laser oscillation, is formed on a predetermined region of the cavity resonator layer C, and a dielectric layer 26a is formed on a remaining region of the cavity resonator layer C. The current for laser oscillation flows into the active layer 24 only via the current constricting layer 26. A p-contact layer 27 is formed on the current constricting layer 26 and the dielectric layer 26a. An upper DBR 28 is formed on a predetermined region of the p-contact layer 27. Like the lower DBR 21, the upper DBR 28 is formed by alternatively stacking two materials 28a and 28b having different refractive indexes. Lower and upper electrodes 30 and 29 are formed on edges of the n-contact layer 22 and the p-contact layer 27, respectively.

As such a VCSEL has been used in optical communications or optical recording media employing a next generation wavelength division multiplexing method, the need for a wavelength tunable VCSEL has been increased. The simplest method of realizing the wavelength tunable VCSEL is to vary a resonance width of the wavelength tunable VCSEL so as to vary a wavelength of laser light emitted from the wavelength tunable VCSEL by heating or cooling the wavelength tunable VCSEL.

However, if a wavelength of emitted light varies by varying an operation temperature, since it is difficult to rapidly vary the operation temperature, it is also difficult to rapidly vary the wavelength of the emitted light. In addition, if the operation temperature increases, laser oscillation characteristics may be sharply reduced due to excessive gain loss, thereby limiting a variable range of the operation temperature. Also, the VCSEL may stop operating due to sudden discharge during the variation of the operation temperature.

SUMMARY OF THE INVENTION

Accordingly, the present invention provides a VCSEL capable of rapidly varying a wavelength of emitted laser light without varying a temperature.

According to an aspect of the present invention, there is provided a wavelength tunable VCSEL including a semiconductor substrate, a first electrode, a lower distributed Bragg reflector, a current constricting layer, a cavity resonator layer, second electrodes, an upper distributed Bragg reflector, and third electrodes. The first electrode is formed underneath the semiconductor substrate. The lower distributed Bragg reflector is formed on the semiconductor substrate. The current constricting layer is formed on the lower distributed Bragg reflector. The cavity resonator layer is formed on the current constricting layer. The second electrodes are formed on the cavity resonator layer to be spaced apart from each other and supply carries for laser oscillation to an active layer, along with the first electrode. The upper distributed Bragg reflector is formed between the second electrodes spaced apart from each other. The third electrodes are formed on the upper distributed Bragg reflector to be spaced apart from each other and vary an effective resonance region, together with the second electrodes.

The semiconductor substrate is a compound semiconductor substrate.

Each of the upper and lower distributed Bragg reflectors is formed by alternatively stacking first and second compound semiconductor layers having different refractive indexes and doped with impurities limited to $10^{21}/cm^3$.

The cavity resonator layer is a stack of an n-lower carrier limiting layer, the active layer, and a p-upper carrier limiting layer.

The cavity resonator layer includes an active layer which is one of a binary compound semiconductor layer, a ternary compound semiconductor layer, and a quaternary compound semiconductor layer, each of which has one of a multi-quantum well (MQW) structure and a quantum dot structure.

The upper distributed Bragg reflector is a monolithic distributed Bragg reflector or a distributed Bragg reflector fused to a substrate.

Compared to an existing VCSEL, the wavelength tunable VCSEL can rapidly change a wavelength of emitted light and prevent the deterioration of gain characteristics of laser oscillation due to variations in the width of the effective resonance region according to variations in a temperature. As a result, a wavelength tunable region of emitted laser can be increased.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF THE INVENTION

Hereinafter, a wavelength tunable VCSEL according to an embodiment of the present invention will now be described with the attached drawings. In drawings, the thicknesses of layers or regions are exaggerated for clarity.

Figure 1:
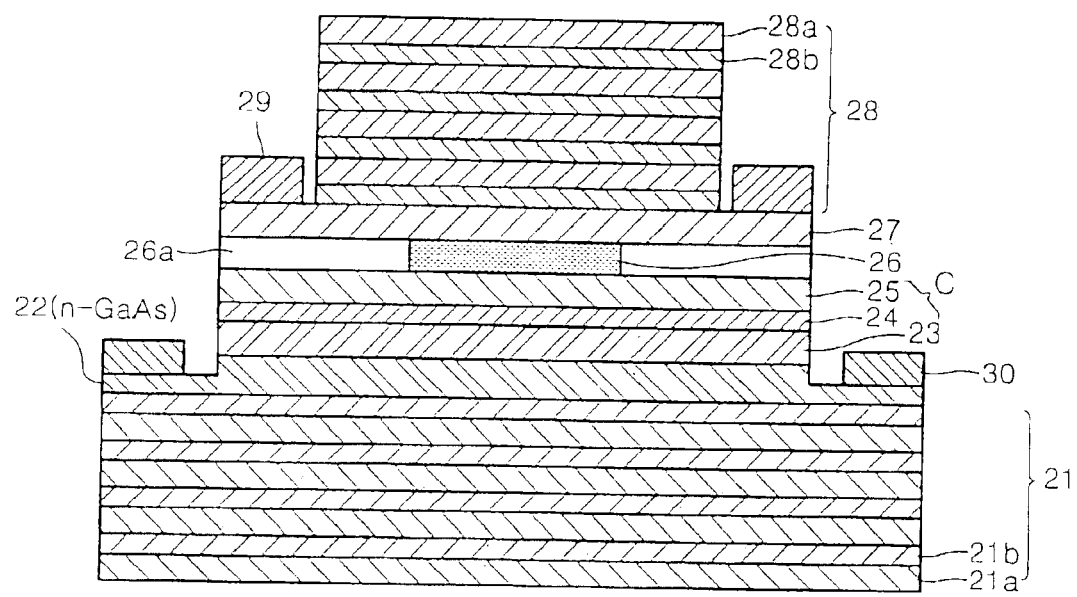
FIG. 1 is a cross-sectional view of a VCSEL according to the prior art.
Figure 2:
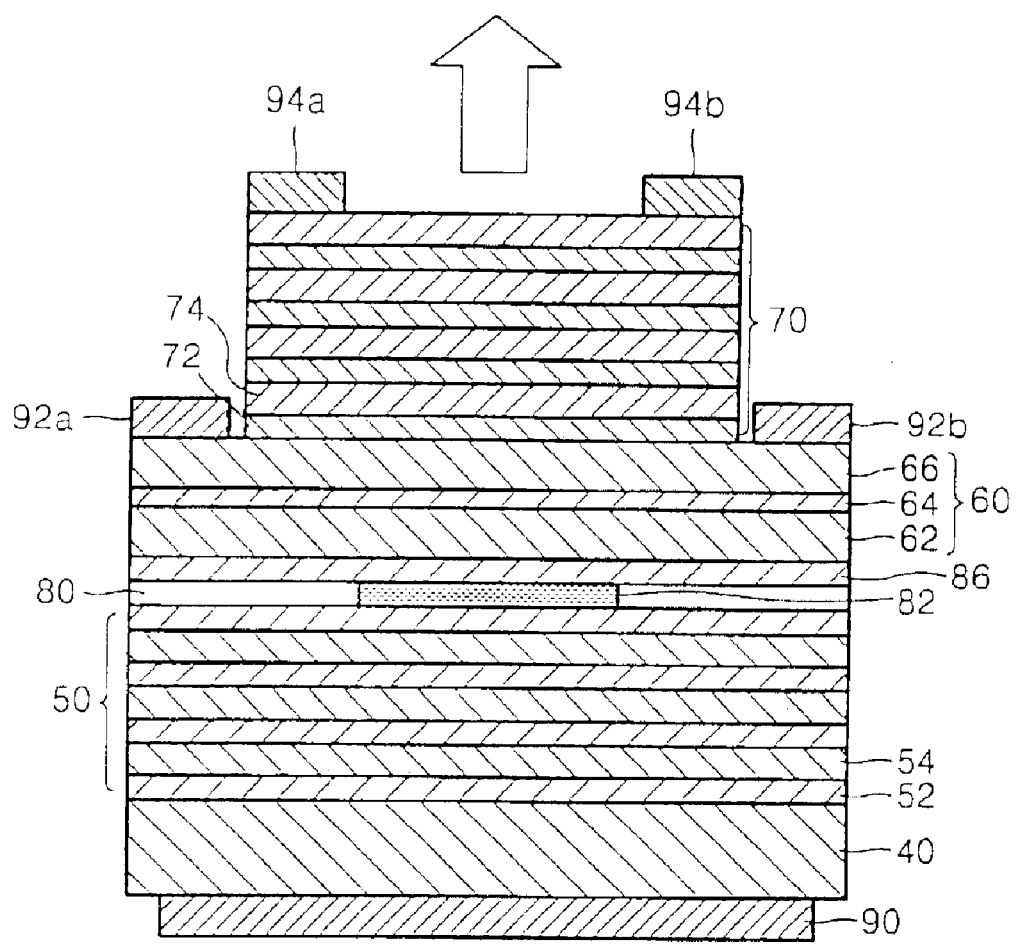
FIG. 2 is a cross-sectional view of a wavelength tunable VCSEL according to an embodiment of the present invention.

Referring to FIG. 2, reference numeral 40 denotes a substrate which is a compound semiconductor substrate on which lower and upper distributed Bragg reflectors (DBRs) 50 and 70 and a cavity resonator layer 60 are formed. The lower DBR 50 is formed on the substrate 40. The lower DBR 50 is formed by alternatively stacking first and second compound semiconductor layers 52 and 54. It is preferable that the first and second compound semiconductor layers 52 and 54 do not absorb light emitted from the cavity resonator layer 60. Accordingly, it is preferable that an energy bandgap of the first and second compound semiconductor layers 52 and 54 is greater than an oscillation wavelength. For example, both of the first and second compound semiconductor layers 52 and 54 are AlGaAs layers. Here, since it is preferable that the first and second compound semiconductor layers 52 and 54 have different refractive indexes, it is preferable that the doping level of the AlGaAs layer used as the first compound semiconductor layer 52 is different from the aluminium mole fraction level of the AlGaAs layer used as the second compound semiconductor layer 54. In order to allow current to flow therethrough, the first and second compound semiconductor layers 52 and 54 are compound semiconductor layers doped with n-type impurities. These characteristics of the lower DBR 50 are applied to the upper DBR 70 as they are.

Meanwhile, since the wavelength tunable VCSEL according to the present invention emits light via the upper DRB 70, it is preferable that a reflectance of the upper DBR 70 is lower than a reflectance of the lower DBR 50.

An upper portion of the lower DBR 50 is composed of a current constricting layer 82, a dielectric layer 80 formed around the current constricting layer 82, and an n-type compound semiconductor layer 86 covering the current constricting layer 82 and the dielectric layer 80. The current constricting layer 82 is a channel of a current flowing into the cavity resonator layer 60 via the lower DBR 50. The dielectric layer 80 intercepts a current flowing into another region not the current constricting layer 82. The dielectric layer 80 and the current constricting layer 82 are formed by growing an AlGaAs layer of the lower DBR 50 having a great bandgap and an increased aluminium mole fraction, and then selectively oxidizing the AlGaAs layer. The cavity resonator layer 60 is formed on the lower DBR 50. The cavity resonator layer 60, from which a laser is oscillated, is a stack of an n-lower carrier limiting layer 62 which serves to confine carriers, an active layer 64 in which the carriers are recombined, and a p-upper carrier limiting layer 66. The active layer 64 is a binary, ternary, or quaternary compound semiconductor layer having a multi-quantum well (MQW) structure or a quantum dot structure. For example, the active layer 64 is a GaAs layer, an InGaAs layer, an AlGaAs layer, an InAs layer, a GaInNAs layer, or a GaPSb layer. It is preferable that the cavity resonator layer 60 is stacked to a thickness corresponding to integral multiplies of an oscillated wavelength in order to satisfy the resonance condition.

The upper DBR 70 is formed on a predetermined region of the p-upper carrier limiting layer 66 of the cavity resonator layer 60. The upper DBR 70 is formed by alternatively stacking third and fourth compound semiconductor layers 72 and 74 having different refractive indexes. It is preferable that the third and fourth compound semiconductor layers 72 and 74 have p-type impurity doping characteristics. Here, it is preferable that the third and fourth compound semiconductor layers 72 and 74 are heavily doped with impurities, e.g., doped with impurities limited to $10^{21}/cm^3$ in order to increase a wavelength tunable region.

A first electrode 90 is formed underneath the substrate 40. The first electrode 90 is a lower electrode which is an ohmic contact metal layer for injecting a current. Second electrodes 92a and 92b are formed on the p-upper carrier limiting layer 66 around the upper DBR 70. It should be noted that second electrodes 92a and 92b can be in the form of a single electrode that might be of an annular shape. The second electrodes 92a and 92b are formed so as not to contact the upper DBR 70. The second electrodes 92a and 92b are upper electrodes which are ohmic contact metal layers for injecting a current. The third electrodes 94a and 94b are formed on the upper DBR 70 to serve to adjust an effective resonance region, along with the second electrodes 92a and 92b. As with the second electrodes 92a and 92b, the third electrodes 94a and 94b can be in the form of a single electrode. The third electrodes 94a and 94b are formed on edges of the upper DBR 70.

Oscillation of laser starts with the supply of a current to the cavity resonator layer 60 via the first and second electrodes 90, 92a, and 92b and a recombination of carriers in the active layer 64. The intensity of light emitted from the active layer 64 due to the recombination of the carriers is increased while the light goes to and from the lower and upper DBRs 50 and 70. When the intensity of the light becomes a given intensity, the light is emitted as laser light via the upper DBR 70, between the third electrodes 94a and 94b, having a reflectance lower than that of the lower DBR 50.

A wavelength of the light emitted via the upper DBR 70 is determined by a width of an effective resonance region of the cavity resonator layer 60. If the third electrodes 94a and 94b are not used, the width of the effective resonance region is not greatly different from a width of the cavity resonator layer 60. Thus, the wavelength of the light emitted via the upper DBR 70 is determined by the width of the cavity resonator layer 60.

However, if a current supplied to the upper DBR 70 is controlled by using the second electrodes 92a and 92b and the third electrodes 94a and 94b, the refractive index of the upper DBR 70 varies. Thus, the effective resonance region extends from the cavity resonator layer 60 to the upper DBR 70. In other words, since the width of the effective resonance region is increased by the extension of the effective resonance region, the wavelength of the laser emitted via the upper DBR 70 is different from the wavelength of the laser emitted when the third electrodes 94a and 94b are not used.

Figure 3:
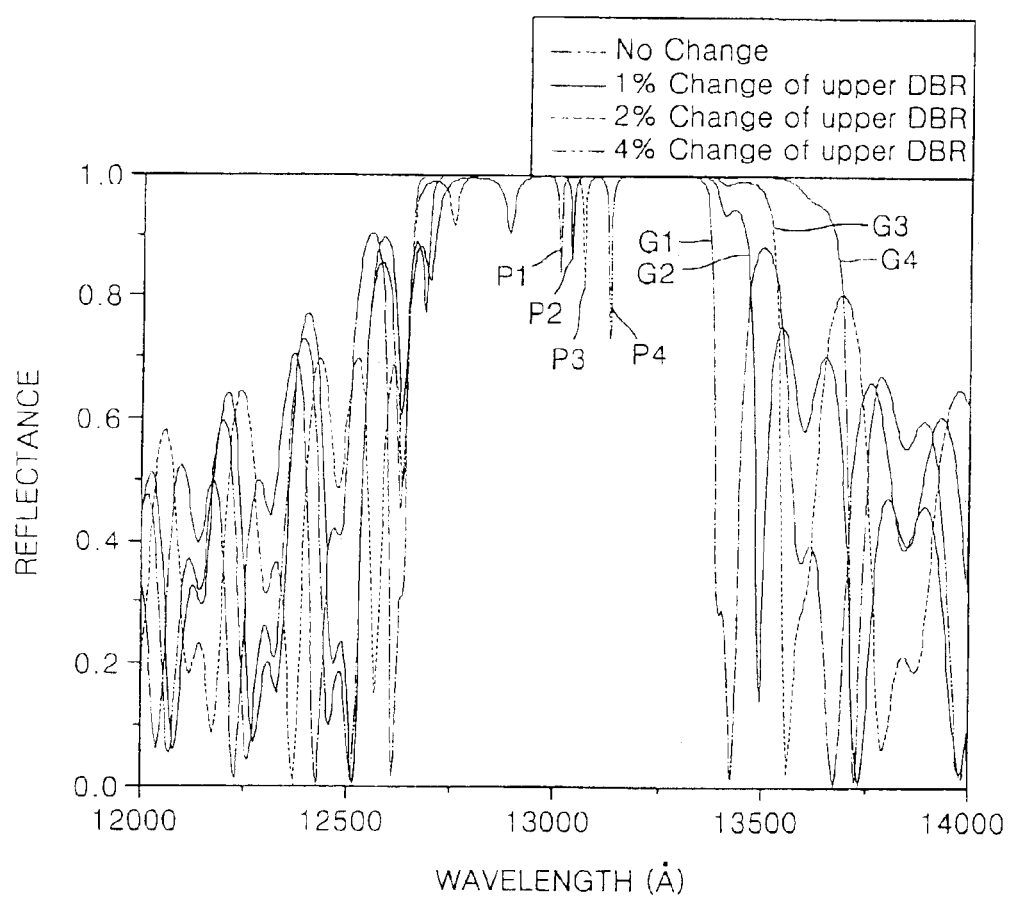
FIG. 3 is a graph showing variations in a refractive index of emitted laser light according to variations in a refractive index of an upper distributed Bragg reflector (DBR) of the wavelength tunable VCSEL shown in FIG. 2.

FIG. 3 is a graph showing variations in the reflectance of emitted light according to variations in a refractive index of the upper DBR 70. Reference characters G1 through G4 denote first through fourth line graphs showing variations in the reflectance of the laser emitted from the active layer 64 according to variations in the refractive index of the upper DBR 70.

The first line graph G1 represents a case where the third electrodes 94a and 94b are not used, i.e., the refractive index of the upper DBR 70 is not artificially changed (hereinafter referred to as a first case). The second through fourth line graphs G2, G3, and G4 represent cases where a current flowing in the upper DBR 70 is controlled by using the second electrodes 92a 92b and the third electrodes 94a and 94b, i.e., the refractive index of the upper DBR 70 is changed by 1%, 2%, and 4%, respectively (hereinafter referred to as second through fourth cases).

A first cavity peak P1 of the first line graph G1 represents a wavelength of light emitted via the upper DBR 70 in the first case. Also, a second cavity peak P2 of the second line graph G2, a third cavity peak P3 of the third line graph G3, and a fourth cavity peak P4 of the fourth line graph G4 represent wavelengths of laser light emitted via the upper DBR 70 in the second through fourth cases, respectively.

In the first through fourth line graphs, positions of the first through fourth cavity peaks P1, P2, P3, and P4 are different. As described, this means that a wavelength of light emitted via the upper DBR 70 can vary by changing the refractive index of the upper DBR 70 to vary the width of the effective resonance region.

Many contents have been described, but they must be interpreted as an example of a preferred embodiment not being restricted to the scope of the present invention. For example, the dielectric layer 80 of the VCSEL according to the embodiment of the present invention can be replaced with an air gap by one of ordinary skill in the art. Also, instead of forming the first electrode 90 used as a lower electrode underneath the substrate 40, the first electrode 90 can be formed so as to contact the n-type compound semiconductor layer 86. Thus, the scope of the present invention must be defined by the appended claims not the above-described embodiment.

As described, a VCSEL according to the present invention includes additional electrodes and upper electrodes, which are formed on an upper DBR and used for varying a width of an effective resonance region, and a current constricting layer, which is formed on a lower DBR. Using the present invention, a wavelength of emitted light can be tuned by applying a current to the upper DBR to change a width of an effective resonance region. Thus, compared to the prior art VCSEL, the VCSEL of the present invention can rapidly change the wavelength of emitted light and prevent the deterioration of gain characteristics of laser oscillation due to variations in a width of an effective resonance region according to variations in a temperature. Also, since an increase or a decrease in the amount of a current supplied to the upper DBR hardly has a bad effect on the gain characteristics of laser oscillation, a wavelength tunable region of emitted light can be extended due to the increase or the decrease in the current applied to the upper DBR.

What is claimed is:

1. A wavelength tunable VCSEL comprising:

a substrate;

a first electrode which is formed underneath the substrate;

a lower distributed Bragg reflector which is formed on the substrate;

a current constricting layer which is formed on the lower distributed Bragg reflector;

a cavity resonator layer which is formed on the current constricting layer;

an upper distributed Bragg reflector which is formed on a predetermined region of the cavity resonator layer;

a second electrode which is formed on the cavity resonator layer around the upper distributed Bragg reflector and used along with the first electrode for laser oscillation; and third electrode which is formed on the upper distributed Bragg reflector and used along with the second electrode for changing a width of an effective resonance region.

2. The wavelength tunable VCSEL of claim 1, wherein each of the upper and lower distributed Bragg reflectors is formed by alternatively stacking first and second compound semiconductor layers having different refractive indexes, and the upper distributed Bragg reflector is doped with impurities limited to $10^{21}/cm^2$.

3. The wavelength tunable VCSEL of claim 1, wherein the cavity resonator layer includes an active layer which is one of a binary compound semiconductor layer, a ternary compound semiconductor layer, and a quaternary compound semiconductor layer, each of which has one of a multi-quantum well (MQW) structure and a quantum dot structure.

4. The wavelength tunable VCSEL of claim 3, wherein the compound semiconductor layer is one of a GaAs layer, an lnGaAs layer, AlGaAs layer, an InsAs layer, a GaInNAs layer, and a GaPSb layer.

* * * * *